United States Patent [19]

Gitlin et al.

[11] 4,207,566
[45] Jun. 10, 1980

[54] DC CURRENT LEVEL DETECTOR FOR MONITORING A PITOT TUBE HEATER AND ASSOCIATED METHOD

[75] Inventors: Robert Gitlin, East Meadow; Evan Mayerhoff, Great Neck, both of N.Y.

[73] Assignee: American Aerospace Controls, Inc., Farmingdale, N.Y.

[21] Appl. No.: 903,195

[22] Filed: May 5, 1978

[51] Int. Cl.$^2$ ............................................. G08B 21/00
[52] U.S. Cl. .................................... 340/664; 340/640; 340/655
[58] Field of Search ............... 340/635, 640, 655, 664; 324/117 R, 127, 133; 360/111

[56] References Cited

U.S. PATENT DOCUMENTS

| | | | |
|---|---|---|---|
| 2,785,233 | 3/1957 | Stuart, Jr. | 360/111 |
| 3,005,878 | 10/1961 | Wiegand | 360/111 |
| 3,774,189 | 11/1973 | Brown | 340/664 |
| 4,037,194 | 7/1977 | Boyden et al. | 340/664 |

*Primary Examiner*—James W. Moffitt
*Assistant Examiner*—Joseph A. Popek

*Attorney, Agent, or Firm*—Posnack, Roberts, Cohen & Spiecens

[57] ABSTRACT

A DC current level detector is provided for monitoring the heater current of a pitot tube. The detector includes a toroidal core defining a bore through which can be passed a line carrying the current to be detected whereby an amount of flux is generated in the core according to the current to be detected. A reference circuit is provided to generate in the core a reference amount of flux against which the first flux is compared in an algebraic combination. An oscillator circuit is inductively coupled to the core to saturate the core in opposite directions. The algebraic difference between the fluxes is employed to generate a signal to operate a relay. The relay is included in a circuit in which are connected a power source and an indicator such as an alarm lamp. The core is of toroidal shape and a casing is provided which houses the core along with the associated circuits and which is provided with an opening corresponding with the bore of the core. The line carrying the current to be detected or monitored is passed through the opening in the casing and through the bore of the toroidal core.

14 Claims, 4 Drawing Figures

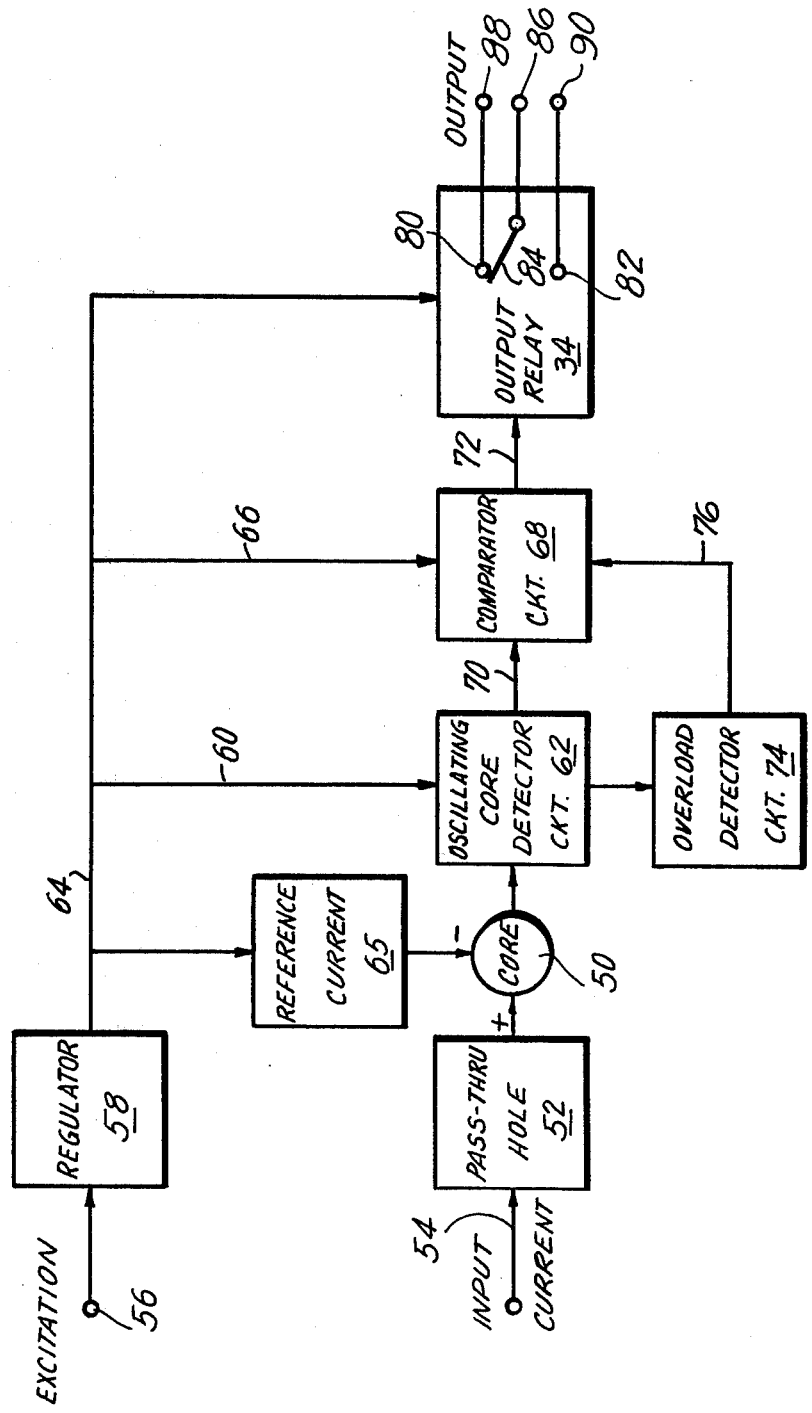

DC CURRENT LEVEL DETECTOR FOR MONITORING A PITOT TUBE HEATER AND ASSOCIATED METHOD

FIELD OF INVENTION

This invention relates to electronic signal monitoring devices and more particularly to current level detectors.

BACKGROUND

American Aerospace Controls, Inc., of Farmingdale, New York, provides a series of current sensors which are used extensively for measurement and control applications. They are particularly well suited for overload detection of current in high voltage lines such as in radio and T.V. transmitting equipment and power supplies. Other applications include current leakage detection and sensing the difference between two current levels. A sensor will produce an output proportional to the difference in current when two cables are inserted in a "pass thru hole" with currents flowing in opposite directions. Sensors are also used in process and power control applications and can be obtained with current level instead of voltage level output for direct input to ammeters, recorders or external relay coils.

The above type of current sensors provide preferably a linear DC output voltage corresponding to a DC current input. A "pass thru hole" accepts the current carrying cable without the need for breaking into the line and is thus non-invasive. The output is isolated from the current line. The construction of the above-noted apparatus utilizes a saturable toroidal core to sense magnetic flux associated with the current flow. A detection and signal conditioning circuit produces an extremely stable, accurate and repeatable output over a wide ambient temperature range.

SUMMARY OF INVENTION

It is an object of the invention to provide an improved contactless DC current sensing relay designed especially for the aviation industry.

It is another object of the invention to provide a contactless DC current sensing device especially suited for monitoring the heater of a pitot tube of the type used to sample air streams to measure aircraft velocity, and of the type which is heated to preclude ice build-up and consequent blockage.

It is a further object of the invention to provide a small lightweight rugged device having a relatively small volume which is substantially impervious to humidity, fungus and salt spray and which is adapted to withstand shock, vibration and high altitudes.

It is still a further object of the invention to provide an improved current sensor with the input current isolated from the associated detector and with the output isolated from the input current and, moreoever, with the output isolated from excitation power.

Still another object of the invention is to provide a device of the above-noted type having ruggedized construction, high reliability, a fully potted structure, and capable of giving results with long term repeatability.

In achieving the above and other objects of the invention, there is provided a DC current level detector comprising a toroidal core defining a bore through which can be passed a line carrying the current to be detected whereby an amount of flux is generated in said core according to the current to be detected, reference means to generate in said core a reference amount of flux against which the first said flux is compared, oscillator means inductively coupled to said core to saturate said core in opposite directions subject to the difference between the first two said fluxes, relay means, and comparator means responsive to said oscillator means and a predetermined magnitude of said difference to actuate said relay means.

According to a feature, the aforesaid relay means is a single-pole double-throw relay selectively providing open or closed output circuits.

According to a further feature, a casing may be provided with an opening corresponding with the bore of said core. The casing houses said core, reference means, oscillator means and comparator means and a potting is provided in said casing in which the reference means, oscillator means and comparator means are embedded.

According to still a further feature, the relay means may be housed within the casing and embedded within the aforesaid potting.

According to a further feature, there may be provided a regulator means to regulate said reference means and protect said detector against noise, ripple, spikes, surges and variation.

According to yet another feature of the invention, the relay means may be actuated when the flux caused by the current through said line is less than the reference amount of flux. An overload detector means may be provided for preventing actuating of the relay means when the flux caused by the current through said line exceeds the reference amount of flux by a predetermined amount.

According to another aspect of the invention, apparatus is provided for use with a pitot tube. This apparatus comprises a pitot tube heater, a line supplying current to said heater, indicating means for indicating a malfunctioning of said heater, and current sensing means inductively coupled in non-invasive manner to said line for activating said indicating means upon a reduction of current flow through said line from a predetermined normal value.

According to a further feature of the invention, there may be provided a source of power for said indicating means and said current sensing means may include a relay actuated by the current in said line and adapted to couple said indicating means and source in closed circuit relation.

The relay may be coupled in series relationship with said source and said indicating means and may be preferably as indicated above, a single-pole double-throw relay having an open circuit condition induced when normal current is flowing through said line and a closed circuit condition induced when less than said normal current is flowing through said line.

As has been noted hereinabove, the current sensing means may include a toroidal core and a casing housing said core, said core and casing being provided with a common bore through which the aforesaid line passes at least once.

According to a further aspect of the pitot heater monitoring apparatus, there may further be comprised an input winding inductively coupled to said core and reference means to supply a reference current to said input winding; an output winding inductively coupled to said core and further coupled to said relay to control the same; regulator means coupled between said reference means and input winding for protection against noise, ripples, spikes, surges, and variation in the reference current; oscillator means including a winding inductively coupled to said core and adapted to drive the same to saturation in opposite magnetic directions; comparator means between said output winding and said relay to control the latter dependent on the net effect on said core of the input winding and the current flowing through the aforesaid line.

According to a feature of the invention, the line is isolated from said input and output windings.

According to yet another aspect of the invention, there is provided a method of actuating a relay to indicate malfunctioning of a pitot tube heater, said method comprising generating a reference amount of flux in a core, generating a second amount of flux in said core according to current flowing through said heater for algebraic combination with the first said flux, generating an oscillating flux in said core, and converting the algebraic combination of flux into a signal to operate said relay.

According to another aspect of the aforesaid method, the core is formed as a toroid and the current supplied to said heater is applied through a line which is passed through said toroid.

The above and other objects, features and advantages of the invention will become apparent from a detailed description of a preferred embodiment which follows hereinafter.

BRIEF DESCRIPTION OF DRAWINGS

In the drawing in which is illustrated a preferred embodiment of the invention:

FIG. 2 is a block diagram illustrating the circuit of the sensor;

DETAILED DESCRIPTION

The DC current level detector of the invention is a reliable and proven means of monitoring current flow in DC equipment. The sensor provides this function without direct electrical connection to the line being monitored and in this way preserves the integrity of the line. The monitored line is threaded through a hole in the sensor permitting the sensor to detect the current induced magnetic field which results. A single-pole double-throw electromechanical relay is activated at a fixed current level or trip point providing either a contact closure or opening depending on the application needs and hook-up to the output relay.

The sensor provides electrical isolation between the current feed line and the instrument case, the electronic circuitry and the output contacts. There is also complete electrical isolation between the excitation voltage and the output contacts. These design features enhance the reliability and safety of the sensor when used in sensitive aircraft applications.

The monitor is set to trip when, for example, the line current falls below a DC current level zone of 0.85 to 1.15 amperes. One ampere is the nominal trip level. When monitored current flow is reduced below the one ampere trip zone or is disrupted due to a power cut-off condition or a failure of the monitored equipment, a relay in the sensor is deenergized and changes contact position thus providing for the actuation of external warning alarms or control devices. When current flow is restored above the actual trip point, the sensor automatically resets and the relay arm goes back to its energized position.

The illustrated sensor can be mounted in an aircraft using standard installation practices. It can be rigidly mounted in any position. For installation in an aircraft, the positive wire feeding the device to be monitored is disconnected. If required, this wire is rerouted for a convenient mounting of the detector. The supply wire is threaded through the sensor of the invention in a manner which will next be indicated by reference to FIG. 1.

Figure 1:
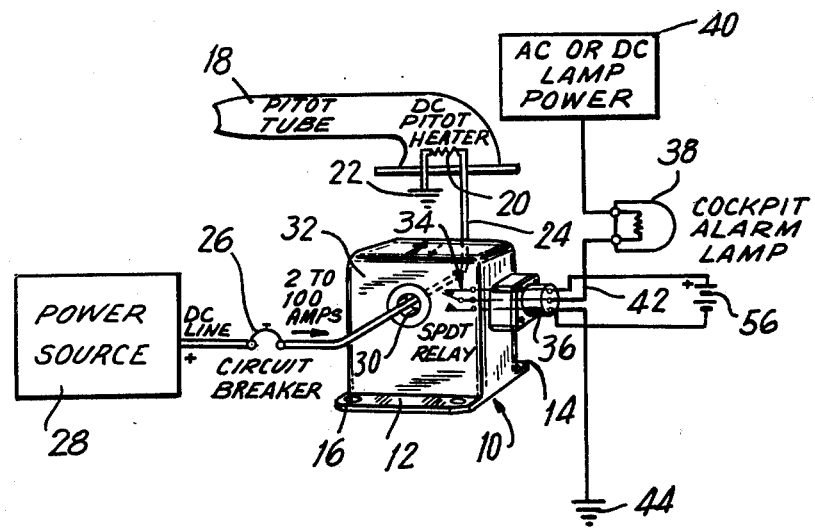
FIG. 1 is a diagrammatic view illustrating the combination of a pitot tube with the current level detector of the invention and an alarm or indicator circuit coupled thereto.

In FIG. 1 is illustrated a DC current level detector 10 having flanges 12 and 14 in which are provided openings 16 for attachment to an aircraft. On the aircraft is conventionally mounted a pitot tube 18. The pitot tube is provided with a heater 20 which is intended to heat the pitot tube and prevent accumulations of snow and ice which might deteriorate the performance of the pitot tube. The heater is grounded at 22 and is supplied with a positive line for the passage of heater current. The line is indicated at 24. It may be provided with a circuit breaker indicated at 26 and the source of power or current is indicated at 28.

The line passes through an opening 30 in the casing 32 of the device. This opening as will be shown hereinafter is common to the casing and to a toroidal magnetic core which is employed in the apparatus. Also included and housed within the casing is a relay indicated generally at 34, connections to the relay being made through a coupling 36.

An alarm lamp is indicated at 38. It is supplied with power from a source 40. The lamp 38 is an indicating device which may take any one of a wide variety of forms. It is connected serially with the power source 40 and is coupled via line 42 to the relay device and thence to ground such as indicated at 44. The connection or actuation of the relay 34 is such as to provide an opened circuit or closed circuit condition whereby the lamp 38 is either operated or extinguished, according to whether an alarm condition is to be indicated.

An actual example of the device being disclosed is designed to withstand the environmental conditions normally found in aircraft and described in Radio Technical Commission for Aeronautics Document DO-160. The environmental conditions are as follows:

Maximum Altitude: 50,000 feet
Temperature Range: −50° C. to +70° C.
Humidity: 95%
Shocks: 6 g.
Vibration: 4 g.
Pressure: 25 PSIA
Operation in Explosive Atmosphere
Withstand Rapid Decompression
Fungus Resistance In addition, the device meets severe electrical environment conditions including a wide range of excitation voltages, momentary voltage surges, high voltage spikes, ripple and electro-magnetic interference. In addition, the device will not cause electro-magnetic interference.

The block diagram of the circuit of the device appears in FIG. 2 wherein is shown a toroidal core 50 to which reference has been made generally above and through which is passed at least one time the positive line feeding current to the pitot feeder noted above. This is the only coupling between the line and sensing device so that the sensing is a non-invasive technique as was mentioned hereinabove.

The pass thru hole of the core 50 is diagrammatically indicated at 52 and the input current passing through the aforenoted line feeding the pitot heater is indicated diagrammatically at 54.

A source of excitation voltage is indicated at terminal 56. This current passes to a regulator 58 which is connected via line 60 to an oscillating core detector circuit 62. The reference current which is tapped off of a line 64 is indicated diagrammatically at 65.

Line 64 is further connected via line 66 to a comparator circuit 68. The regulator also feeds the output relay 34 which has been referred to hereinabove. The detector circuit 62 is connected via line 70 to comparator circuit 68 which is in turn connected via line 72 to the relay 34. It will be further noted that the device is provided with an overload detector circuit 74 which is connected via a line 76 to comparator circuit 68.

The output relay is provided with two contacts 80 and 82 and a moveable blade 84 so that a circuit is completed between terminal 86 and either terminal 88 or 90, the purpose of which becomes apparent upon inspection of FIG. 1 as mentioned hereinabove.

The purpose of the regulator circuit 58 is to regulate input excitation voltage to a form usable by the rest of the circuit. This regulator circuit protects the components from noise, ripple, spikes, surges and variations in the excitation signal.

The reference current mentioned hereinabove is applied to the core and the total of ampere turns is equal to the trip current. The pass thru hole indicated above is the hole, as mentioned above, through which the wire carrying the input current to the heater is passed. The input current is thus isolated physically and electrically from the excitation and the output relay contacts.

The core indicated above surrounds the pass thru hole. It provides a means for algebraically summing the input current and the reference current or actually the fluxes relating thereto.

The oscillating core detector circuit measures the difference between the input current and the reference current or provides a means to measure the difference between the fluxes resulting therefrom. An oscillator consisting of transistors, resistors and the transformer produces a signal which is applied to the toroidal transformer. This would cause the transformer to saturate first in one direction, and then the other. When the net applied current or ampere turns is zero, it takes equal amounts of ampere turns of drive current and equal amounts of flux to saturate the core in both the positive and negative directions and the oscillating signal is thus a square wave. When the net applied current is, for example, when greater than zero, that is the input current is above the reference current and trip point, it takes less flux and hence less drive current to saturate the core in the positive direction. Thus, the oscillating signal is no longer a square wave. When this signal is rectified and filtered, a negative differential voltage is produced. Similarly, when the net applied current is less than zero with the input current being below the trip point, a positive differential voltage is produced.

The comparator circuit controls the output relay. When the relay is energized, it is because the differential signal is positive indicating that the input current or ampere turns is less than reference current or ampere turns.

The overload detector provides a signal to the comparator indicating that the input current is more than three amps above the reference current. The oscillator or oscillating core detector circuit will be overridden by the overload detector signal.

As noted hereinabove, the output relay provides a single-pole double-throw contact arrangement isolated from the excitation supply and isolated from the input current.

Figure 3:
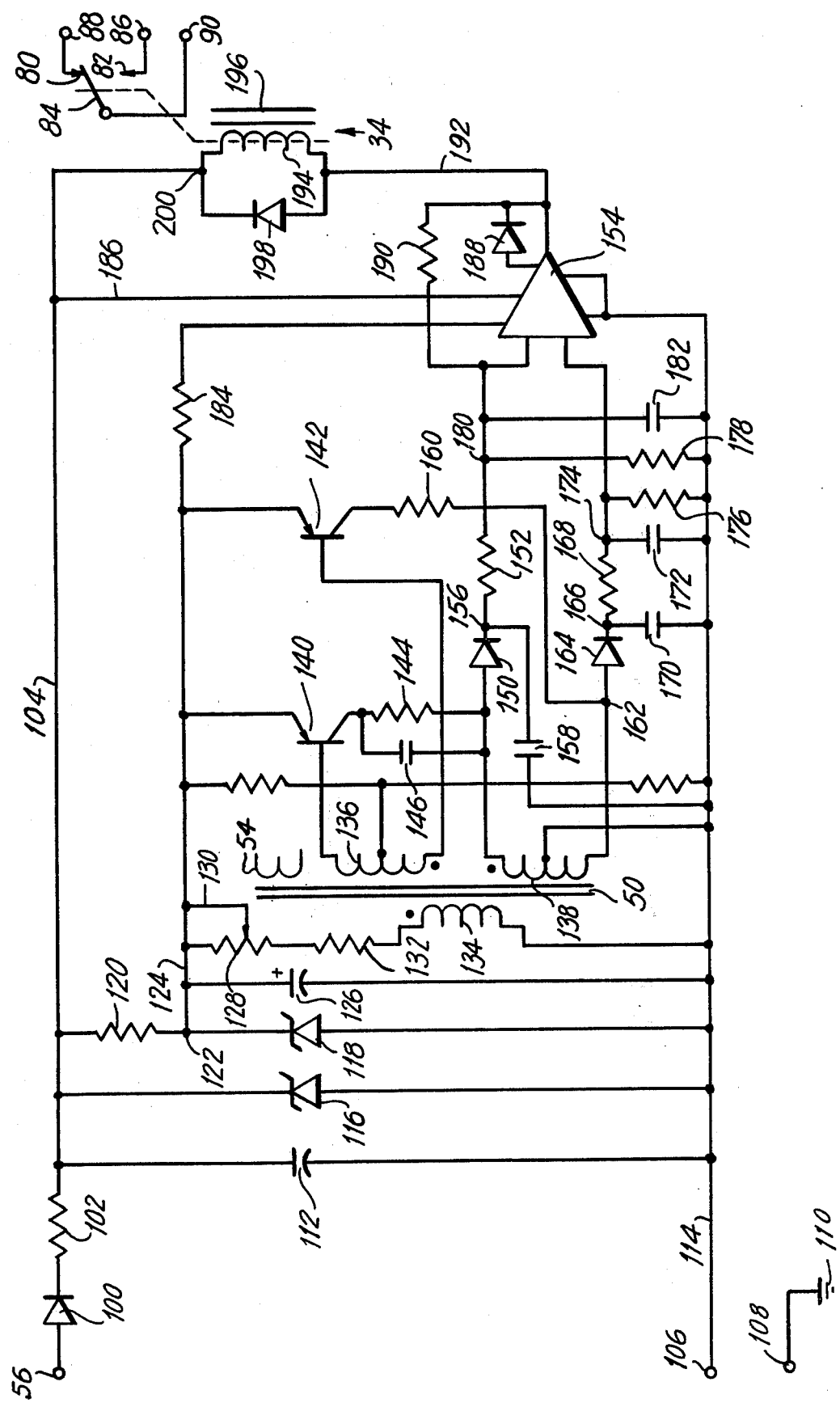
FIG. 3 is a schematic circuit diagram of the current sensor of the invention in accordance with the block diagram of FIG. 2.

FIG. 3 is a schematic diagram of the circuit generally indicated above with respect to FIG. 2. More particularly, the excitation signal is provided via terminal 56. It is fed via a diode 100 to a resistor 102 and thence to a line 104.

The other side of the circuit is indicated at terminal 106, there being a terminal 108 which can be grounded as indicated at 110 this providing for the grounding the casing as will be indicated further hereinbelow.

A capacitor 112 connects line 104 with line 114 connected to terminal 106. In parallel with this capacitor is a zener diode 116. A second zener diode 118 is connected in parallel with diode 116 along with resistor 120. A terminal 122 is located between resistor 120 and diode 118. It is connected to a line 124. A capacitor 126 is connected between line 124 and 114 in parallel with diode 118. A potentiometer 128 is connected to line 124 along with its tap 130. This potentiometer is connected via resistor 132 to a winding 134 which is an input winding relative to the core 50 which is generally in toroidal form as has been mentioned hereinabove. By means of winding 134, a reference or excitation signal is applied to the core 50 to generate a flux therein. The flux generated in the core 50, by the line being monitored, is algebraically opposite the flux caused by the signal passing through winding 134 so that an algebraic summation of these fluxes occurs in the core 50.

Two further windings 136 and 138 are wound on the core 50. Winding 136 is part of the oscillator circuit mentioned above. This oscillator circuit includes transistors 140 and 142. Transistor 140 is connected via a resistor 144 to the winding 138. A capacitor 146 is connected in parallel to resistor 144. This capacitor 146 constitutes the significant component of the overload detector circuit 74. By means of winding 136, the oscillating signal referred to hereinabove is applied to the core 50.

Winding 138 is an output winding picking up a signal which is fed via a diode 150 and a resistor 152 to an op amp indicated generally at 154. A terminal 156 between diode 150 and resistor 152 is connected by a capacitor 158 to line 114.

Transistor 142 is connected via resistor 160 to terminal 162 connected between winding 138 and a diode 164 connected in turn via terminal 166 to a resistor 168 and thence to op amp 154 mentioned hereinabove. Terminal 166 is connected via capacitor 170 to line 114 with a capacitor 172 connecting terminal 174 to line 114.

A resistor 176 connects terminal 174 to line 14. A resistor 178 connects resistor 152 at junction 180 to line 114. A capacitor 182 is connected in parallel to resistor 178.

Line 124 is connected via resistor 184 to op amp 154. Line 104 is connected via line 186 to op amp 154. A diode 188 and a resistor 190 are connected in the feed back circuit of the op amp 154.

The op amp 154 is connected via line 192 to the relay 34 mentioned hereinabove. This relay includes a winding 194 and a core 196. A diode 198 is connected in parallel to winding 194, the junction 200 being connected to line 104.

The terminals 88, 86 and 90 mentioned hereinabove along with blade 84 are illustrated along with contacts 80 and 82 all as previously illustrated relative to FIG. 2.

With cross reference to the operation of the circuit described above relative to FIG. 2, it will be seen that the flux caused by the signal flowing through winding 134 is algebraically added to the flux generated by the current through line 54 (see also FIG. 3) and that this difference is added to the oscillating flux generated in the core through use of the winding 136. The resultant signal is picked up by winding 138 and is then rectified and applied to op amp 154 to enable operation of the relay 134 when a certain difference between the compared fluxes is attained. Such difference may, for example, indicate that the heater 20 (FIG. 1) has burned out. In addition, a surge current may be detected by the operation of the capacitor 146 included in the overload detector circuit 74 (FIG. 2). This signal is also applied to the op amp 154 and applied to the winding 194 of relay 134 to prevent the relay switchover process.

Figure 4:
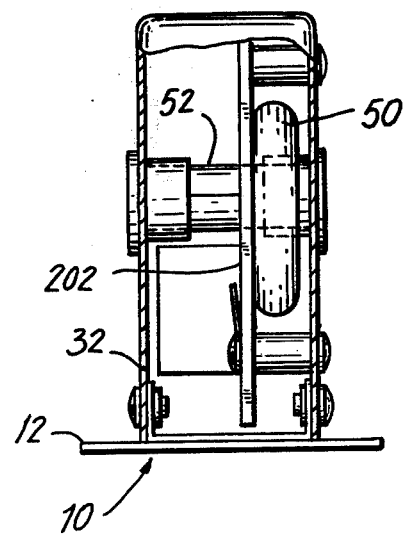
FIG. 4 is a cross-sectional view through the physical structure of the sensor.

FIG. 4 illustrates th toroidal core 50 with the pass thru opening or hole 52 formed in casing 32. Within the casing is also supported a board or plate 202 upon which the circuitry of the device is generally mounted or formed by the use of techniques which are too well known to warrant consideration in this text.

The sensing device described hereinabove provides a single-pole double-throw arrangement of relay contacts which change position at a preset input current level. The output is isolated from both the input current and the excitation current. The output relay contacts change position within 200 milliseconds according to the actual relay employed. Response of the unit is deliberately controlled in order to prevent input current transients from producing a false trip.

The overload detector enables the unit to maintain current readings up to 100 amps or more. The device is protected against the excitation variations so that changes in voltage, ripple, spikes, momentary surges, electromagnetic interference and the like do not cause the unit to fail catastrophically, nor its operation to be degraded.

An open loop circuit is provided with no feed back. The output circuit utilizes a type CA 3094 operational amplifier with no additional signal conditioning components to drive the output relay.

The internal oscillating core operates at approximately 12 kHz. The switching transistors in the oscillator are referenced against an internal reference voltage. This makes it possible to eliminate resistors which might otherwise contribute to errors due to temperature variation. It will be apparent further that the invention provides a method of actuating a relay to indicate malfunctioning of a pitot tube heater. This method comprises generating a reference amount of flux in a core, generating a second amount of flux in said core according to current flowing through said heater whereby results algebraic combination with the first said flux, generating an oscillating flux in said core, and converting the algebraic combination of flux into a signal to operate said relay.

The method may further comprise forming the core as a toroid and supplying current to the aforesaid heater through a line which is passed through the toroid at least once.

What is claimed is:

1. Apparatus for use with a pitot tube, said apparatus comprising a pitot tube heater, a line supplying current to said heater, indicating means for indicating a malfunctioning of said heater, current sensing means inductively coupled in non-invasive manner to said line for activating said indicating means upon a change of current flow through said line from a predetermined normal value, a source of power for said indicating means, said current sensing means including a relay actuated by the current in said line and adapted to couple said indicating means and source in closed-circuit relation, a toroidal core, said line being inductively coupled with said core, an input winding inductively coupled to said core, reference means to supply a reference current to said input winding, an output winding inductively coupled to said core to generate signals dependent on flux generated in said core and further coupled to said relay to control the same, oscillator means including a winding inductively coupled to said core and adapted to drive the same to saturation in opposite magnetic directions, and comparator means between said output winding and said relay to control the relay dependent on the net effect in said core of the input winding, the winding of said oscillator means, and the current flowing through said line.

2. Apparatus as claimed in claim 1 wherein said relay is coupled in series relation with said source and indicating means and is a single-pole double-throw relay having open-circuit condition induced when normal current is flowing through said line and a closed-circuit condition induced when less than said normal current is flowing through said line.

3. Apparatus as claimed in claim 1 wherein said current sensing means includes a casing housing said core, said core and casing being provided with a common bore through which said line passes at least one time.

4. Apparatus as claimed in claim 1 comprising regulator means coupled between said reference means and input winding for protection against noise, ripple, spikes, surges and variation in the reference current.

5. Apparatus as claimed in claim 1 wherein said line is isolated from said input and output windings.

6. A current level detector comprising a toroidal core defining a bore through which can be passed a line carrying the current to be detected whereby an amount of flux is generated in said core according to the current to be detected, reference means to generate in said core a reference amount of flux against which the first said amount of flux is compared, oscillator means inductively coupled to said core to saturate said core in opposite directions subject to the difference between the first two said amounts of flux, relay means, an output winding on said core, and comparator means coupled to said output winding and responsive to said oscillator means and a predetermined magnitude of said difference to actuate said relay means.

7. A current level detector as claimed in claim 6 wherein said relay means is a single-pole double-throw relay selectively providing open or closed output circuits.

8. A current level detector as claimed in claim 7 comprising a casing provided with an opening corresponding with the bore of said core and housing said core, reference means, oscillator means and comparator means, and potting means in said casing and in which said reference means, oscillator means and comparator means are embedded.

9. A current level detector as claimed in claim 8 wherein said relay means is housed within said casing and is embedded in said potting means.

10. A current level detector as claimed in claim 9 comprising a regulating means to regulate said reference means and protect said detector against noise, ripple, spikes, surges and variation.

11. A current level detector as claimed in claim 6 wherein said oscillator means includes a winding coupled to said core and having opposite ends and transistors respectively coupled in symmetric arrangement to said opposite ends to drive the winding of said oscillator means, said comparator means including first and second arrangements of serially connected diodes, resistors, and capacitors symmetrically coupled to opposite ends of said output winding to rectify and integrate the output of the output winding.

12. A D.C. current level detector as claimed in claim 6 further comprising overload detector means for actuating the relay means when the flux caused by the current through said line exceeds the reference amount of flux by a predetermined amount.

13. A method of actuating a relay to indicate malfunctioning of a pitot tube heater, said method comprising generating a reference amount of flux in a core, generating a second amount of flux in said core according to current flowing through said heater for algebraic combination with the reference flux, generating an oscillating flux in said core for combination with the algebraic combination of flux, and converting the thusly resulting flux into a signal to operate said relay.

14. A method as claimed in claim 13 comprising forming said core as a toroid and supplying current to said heater through a line which is passed through said toroid to generate said second amount of flux.

* * * * *